United States Patent
Barnes et al.

(10) Patent No.: US 8,285,770 B1
(45) Date of Patent: Oct. 9, 2012

(54) METHOD OF AND CIRCUIT FOR GENERATING PARAMETERS FOR A PREDISTORTION CIRCUIT IN AN INTEGRATED CIRCUIT USING A MATRIX

(75) Inventors: Vincent C. Barnes, El Paso, TX (US); Stephen Summerfield, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1076 days.

(21) Appl. No.: 12/201,718

(22) Filed: Aug. 29, 2008

(51) Int. Cl.
G06F 17/10 (2006.01)
(52) U.S. Cl. ....................................... 708/300
(58) Field of Classification Search .................. None
See application file for complete search history.

(56) References Cited

U.S. PATENT DOCUMENTS

| | | | |
|---|---|---|---|
| 5,299,230 A * | 3/1994 | Jaeger et al. .............. | 375/296 |
| 5,867,065 A | 2/1999 | Leyendecker | |
| 6,741,662 B1 | 5/2004 | Francos et al. | |
| 6,794,936 B2 | 9/2004 | Hsu et al. | |
| 6,798,843 B1 | 9/2004 | Wright et al. | |
| 6,998,909 B1 | 2/2006 | Mauer | |
| 7,085,330 B1 | 8/2006 | Shirali | |
| 7,151,405 B2 | 12/2006 | Nezami | |
| 7,269,231 B2 | 9/2007 | Ding et al. | |
| 7,348,844 B2 | 3/2008 | Jaenecke | |
| 7,372,918 B2 | 5/2008 | Muller et al. | |
| 7,412,469 B2 * | 8/2008 | Dalipi ...................... | 708/300 |
| 7,511,574 B2 | 3/2009 | Hongo | |
| 7,929,927 B2 | 4/2011 | Norris et al. | |
| 2003/0063686 A1 | 4/2003 | Giardina et al. | |
| 2004/0142667 A1 | 7/2004 | Lochhead et al. | |
| 2008/0157819 A1 | 7/2008 | Bhandari et al. | |
| 2008/0157869 A1 | 7/2008 | Bhandari et al. | |
| 2008/0157870 A1 | 7/2008 | Bhandari et al. | |
| 2009/0256630 A1 | 10/2009 | Brobston | |
| 2010/0308910 A1 * | 12/2010 | Barnes ...................... | 330/149 |
| 2011/0064171 A1 * | 3/2011 | Huang et al. .............. | 375/346 |

OTHER PUBLICATIONS

U.S. Appl. No. 12/836,501, filed Jul. 14, 2010, Summerfield.
U.S. Appl. No. 12/201,633, filed Aug. 29, 2008, Summerfield.
U.S. Appl. No. 12/201,642, filed Aug. 29, 2008, Summerfield.
U.S. Appl. No. 12/201,702, filed Aug. 29, 2008, Summerfield.
U.S. Appl. No. 12/201,706, filed Aug. 29, 2008, Summerfield.
Altera Corporation, "Digital Predistortion Reference Design," copyright 1995-2008, pp. 1-2, available at URL: http://www.altera.com/support/refdesigns/sys-sol/wireless/ref-dig-predis.html or from Altera Corporation, 101 Innovation Drive, San Jose, California 95134.
Altera Corporation, "Digital Predistortion," copyright 1995-2008, pp. 1-4, available at URL: http://www.altera.com/end-markets/wireless/advanced-dsp/predistortion/wir-digital-predistortion.html or from Altera Corporation, 101 Innovation Drive, San Jose, California 95134.

(Continued)

*Primary Examiner* — David H Malzahn
(74) *Attorney, Agent, or Firm* — John J. King; Lois D. Cartier

(57) ABSTRACT

A method of generating parameters for a predistortion circuit in an integrated circuit using a matrix is disclosed. The method comprises storing a first column of a first matrix; generating the remaining columns of the first matrix based upon the first column of the matrix; generating a plurality of rows of a second matrix by performing a first set of calculations; and generating the remaining rows of the second matrix by selectively shifting the first rows of the second matrix.

20 Claims, 8 Drawing Sheets

OTHER PUBLICATIONS

Altera Corporation, "Digital Predistortion Reference Design," Application Note AN-314-1.0, Jul. 2003, pp. 1-46, available from Altera Corporation, 101 Innovation Drive, San Jose, California 95134.

Ding, Lei et al., "A Hammerstein Predistortion Linearization Design Based on the Indirect Learning Architecture," *Proc. of the 2002 IEEE International Conference on Acoustics, Speech & Signal Processing*, May 13, 2002, pp. III-2689-III-2692, vol. 3, IEEE., Piscataway, New Jersey, USA.

Gilabert, Pere L. et al., "Multi-Lookup Table FPGA Implementation of an Adaptive Digital Predistorter for Linearizing RF Power Amplifiers With Memory Effects," *IEEE Transactions on Microwave Theory and Techniques*, Feb. 1, 2008, pp. 372-384, vol. 56, No. 2, IEEE, Piscataway, New Jersey, USA.

Kwan, Andrew et al., "Automating the Verification of SDR Baseband Signal Processing Algorithms Developed on DSP/FPGA Platform" *Proc. of the 2006 IEEE Workshop on Signal Processing Systems Design and Implementation*, Oct. 1, 2006, pp. 5-9, IEEE, Piscataway, New Jersey, USA.

\* cited by examiner

| | Process Description | SRAM | Memory for Embedded Processor | Tx Capture RAM | Rx Capture RAM |
|---|---|---|---|---|---|
| Step 1 | Initial Condition | | | | |
| Step 2 | Trigger Capture | | | Tx samples | IF Rx samples |
| Step 3 | Down convert and decimate Rx samples | | | Tx samples | BB Rx samples (in place processing of IF Rx samples) |
| Step 4 | Align Rx Samples with Tx Samples | | | Tx samples | Rx samples |
| Step 5 | Compute $W = U^T Tx$ | | W | Tx samples | Rx samples |
| Step 6 | Compute $V = U^T U$ | | W, $K^2 * M$ 64 bit words | $(V)_{LSW}$ | $(V)_{MSW}$ |
| Step 7 | Perform Cholesky Factorization in place on V (R'R=V) | | W | $(R)_{LSW}$ | $(R)_{MSW}$ |
| Step 8 | Compute $a = R \backslash (R' \backslash W)$ | | a | | |
| Step 9 | Convert a to integer and store | | a | | |

FIG. 9

FIG. 10

METHOD OF AND CIRCUIT FOR GENERATING PARAMETERS FOR A PREDISTORTION CIRCUIT IN AN INTEGRATED CIRCUIT USING A MATRIX

FIELD OF THE INVENTION

The present invention relates generally to integrated circuits, and in particular, to a method of and circuit for generating parameters for a predistortion circuit in an integrated circuit using a matrix.

BACKGROUND OF THE INVENTION

Integrated circuits are an integral part of any electronic device. A variety of integrated circuits are often used together to enable the operation of the electronic device. While integrated circuits are typically designed for a particular application, certain integrated circuits may have configurable logic.

For example, an application specific integrated circuit (ASIC) may have portions comprising configurable logic. Another type of integrated circuit which has configurable logic is a programmable logic device (PLD). A programmable logic device is designed to be user-programmable so that users may implement logic designs of their choices. One type of programmable logic device is a Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose.

Integrated circuits may be used in arrangements for transmitting data. Because data transmitted using a power amplifier (PA) may be distorted, a predistortion circuit may be employed. The purpose of predistortion is to negate the non-linear effects of a power amplifier. Predistortion is achieved by applying a non-linear filter to the signal prior to transmission. The predistortion circuit acts on the transmitted data to cancel the distortion in the PA by implementing an inverse model of the amplifier. The predistortion circuit may be a function having a vector of parameters applied to the sequence of transmitted data. However, implementing a predistortion circuit in a device having programmable logic poses a number of problems.

SUMMARY OF THE INVENTION

A method of generating parameters for a predistortion circuit in an integrated circuit using a matrix is disclosed. The method comprises storing a first column of a first matrix; generating the remaining columns of the first matrix based upon the first column of the matrix; generating a plurality of rows of a second matrix by performing a first set of calculations; and generating the remaining rows of the second matrix by selectively shifting the first rows of the second matrix. The method may further comprise generating a third matrix comprising a transposed matrix of the first matrix. Generating a plurality of rows of a second matrix comprises multiplying rows of the first matrix by rows of the third matrix, while generating the rows of a second matrix comprises selectively adding and subtracting values from the values of the plurality of rows of the second matrix. The method may further comprise storing an upper portion and a diagonal portion of the second matrix.

According to an alternate embodiment, a method of generating parameters for a predistortion circuit in an integrated circuit using a matrix comprises capturing data in sample capture buffers of the integrated circuit; storing a first column of a first matrix in a memory which may be directly accessed by a processor of the integrated circuit; generating the remaining columns of the first matrix based upon the first column of the first matrix; generating a plurality of rows of a second matrix by performing a first set of calculations; and generating the remaining rows of the second matrix by selectively shifting the first rows of the second matrix.

A circuit for generating parameters in an integrated circuit using a matrix is also disclosed. The circuit comprises a predistortion circuit; a sample capture buffer for receiving data from the predistortion circuit and data output by a power amplifier and received by the integrated circuit; an embedded processor of the integrated circuit coupled to the predistortion circuit; and a first memory which may be directly accessed by a processor of the integrated circuit, said first memory storing a first column of a first matrix; wherein the embedded processor generates the remaining columns of the first matrix and predetermined rows of a second matrix based upon the first matrix. The circuit may further comprise parameter buffers coupled to the embedded processor, the parameter buffers storing parameters generated by the embedded processor. The first memory of the circuit may comprise a memory associated with an embedded processor of the device having programmable logic.

BRIEF DESCRIPTION OF THE DRAWINGS

FIG. 9 is a table showing the generation of parameters according to an embodiment of the present invention;

FIG. 10 shows a matrix generated using matrix multiplication according to an embodiment of the present invention.

DETAILED DESCRIPTION

Figure 1:
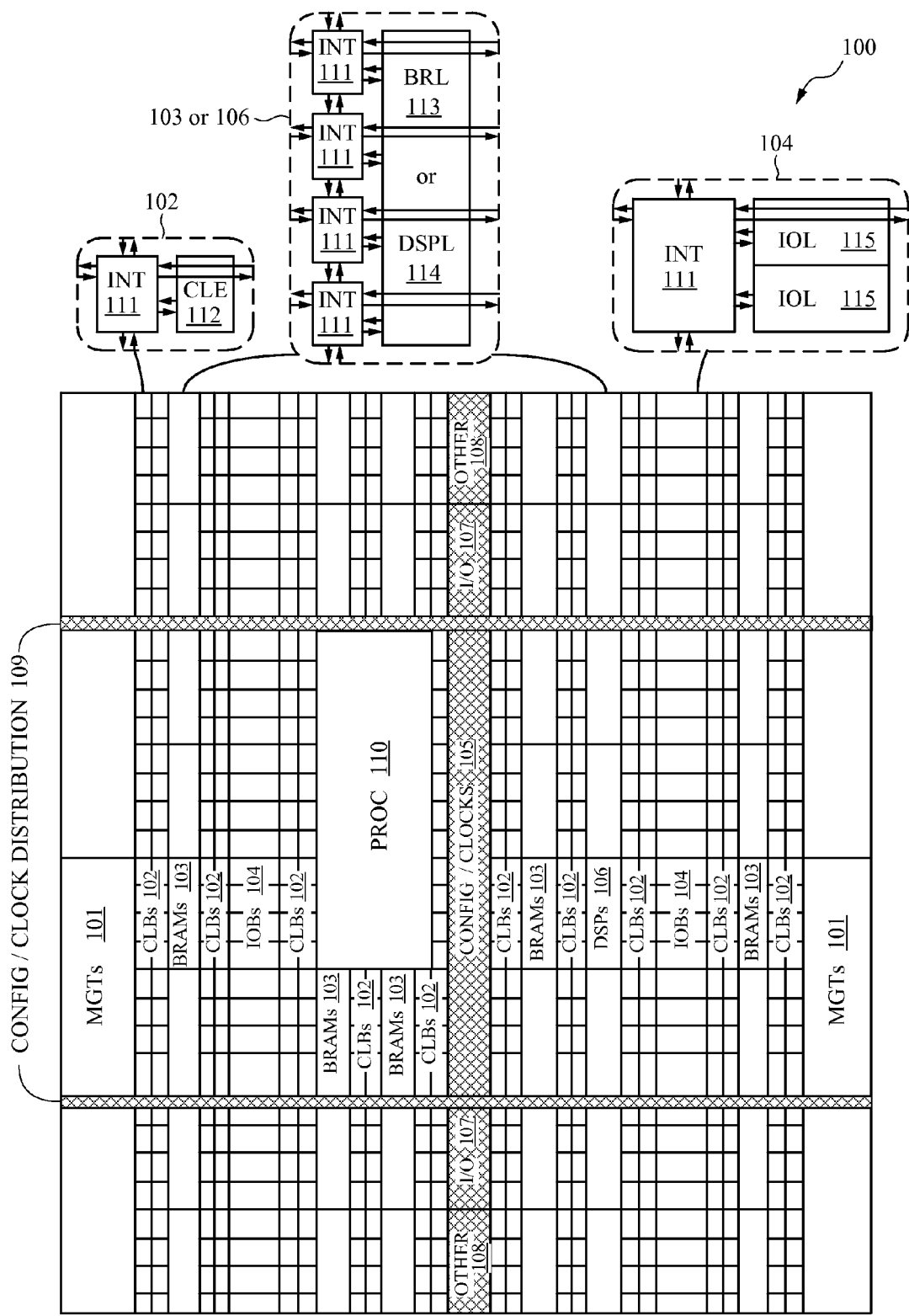
FIG. 1 is a block diagram of a device having configurable logic according to an embodiment the present invention.

Turning first to FIG. 1, a block diagram of a device having configurable logic according to an embodiment the present invention is shown. The device of FIG. 1 comprises an FPGA architecture 100 having a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). The location of connections of the device is controlled by configuration data bits of a configuration bitstream provided to the device for that purpose. As will be described in more detail below, the programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. The circuits and methods of the present invention may be implemented in the PLD of FIG. 1, or in any other suitable device, including any type of integrated circuit having programmable logic.

Figure 2:
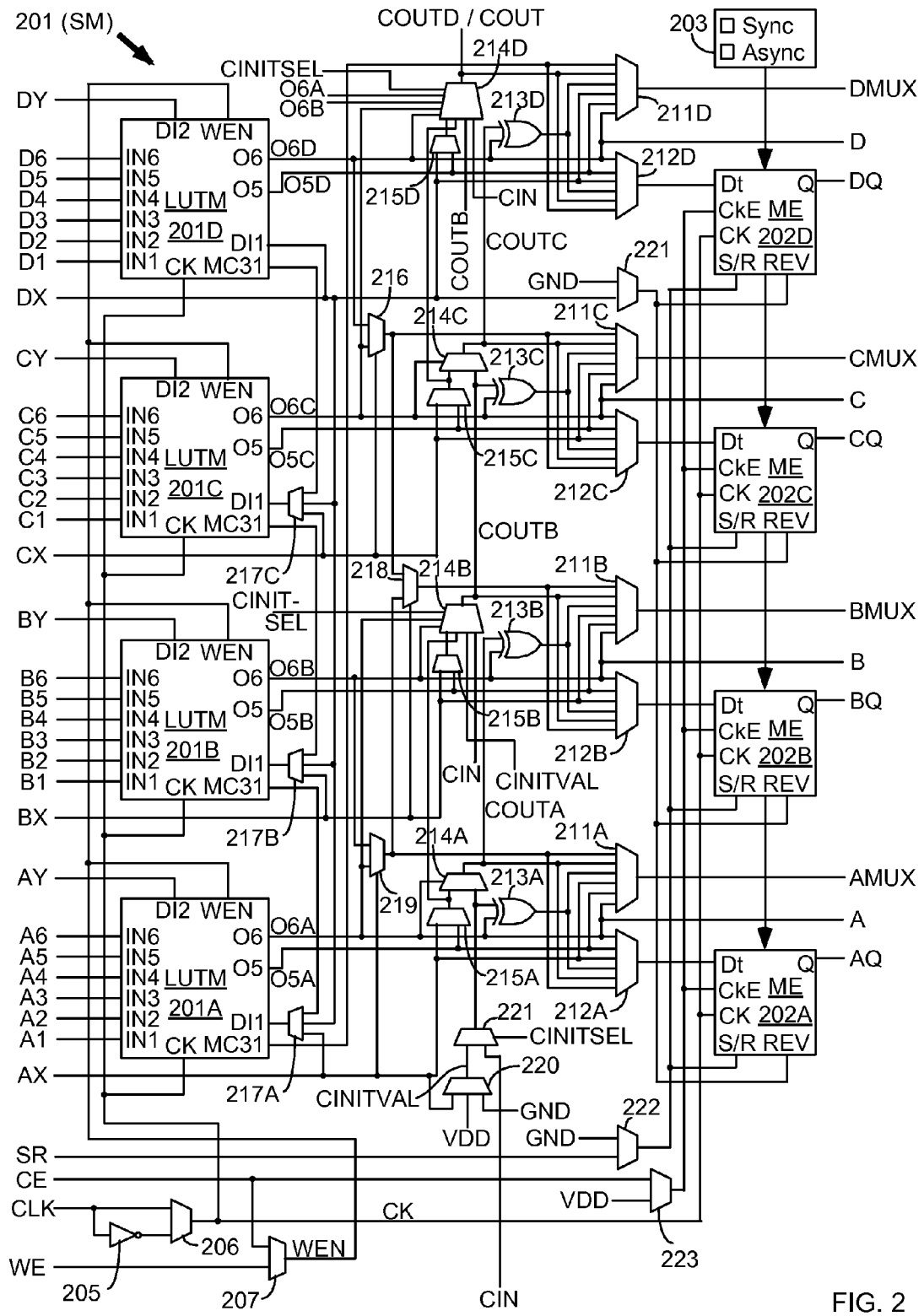
FIG. 2 is a block diagram of a configurable logic element of the device of FIG. 1 according to an embodiment of the present invention.

Turning now to FIG. 2, a block diagram of a configurable logic element of the device of FIG. 1 according to an embodiment of the present invention is shown. In particular, FIG. 2 illustrates in simplified form a configurable logic element of a configuration logic block 102 of FIG. 1. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 202 coupled to a multiplexer 204. In particular, the LUT 202 receives 4 input signals which are decoded to generate an output D1 associated with data stored in the LUT at the address designated by the input signals. The multiplexer 204 is adapted to receive the output of LUT 202 and a registered value of Reg_DI_1. The output of the multiplexer 204 is coupled to a register 206 which generates an output Q1.

A Write Control Circuit 208 is coupled to receive RAM control signals and generate signals to control the LUT 202. In addition to a data input (DI) coupled to receive DI_1 and conventional read and write control signals coupled to a read enable input (R) and a write enable input (W), respectively, the LUT 202 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 210 coupled to a multiplexer 212. The LUT 210 is adapted to receive input signals IN4-IN7, while the multiplexer 212 is coupled to receive the output D2 of the LUT 210 and the registered input value Reg_DI_2. The output of the multiplexer 212 is coupled to a register 214 which generates an output Q2. The write control circuit 208 also generates a partial reset signal and an initial state signal for selectively resetting or setting one or more of the bits of the LUT 210.

Similarly, slice 2 comprises a function generator implemented as a LUT 222 coupled to a multiplexer 224. The LUT 222 is adapted to receive input signals IN8-IN11, while the multiplexer 224 is coupled to receive the output of the LUT 222 and a registered input value Reg_DI_3. The output of the multiplexer 224 is coupled to a register 226 which generates an output Q3. A Write Control Circuit 228 is coupled to receive RAM control signals and generate signals to control the LUT 222. In particular, input signals IN8-IN11 are decoded to generate an output D3 associated with data stored in the LUT at the address designated by the input signals. The LUT 222 comprises a partial reset input (RST) for receiving a partial reset signal, and an initial state input (IS) for receiving an initial state signal. Similarly, slice 2 comprises a function generator implemented as a LUT 230 coupled to a multiplexer 232. The LUT 230 is adapted to receive input signals IN12-IN15, while the multiplexer 232 is coupled to receive the output D4 of the LUT 230 and a registered input value Reg_DI_4. The output of the multiplexer 232 is coupled to a register 234 which generates an output Q4. The write control circuit 228 also generates a partial reset signal and an initial state signal for selectively resetting or setting one or more of the bits of the LUT 230.

Figure 3:
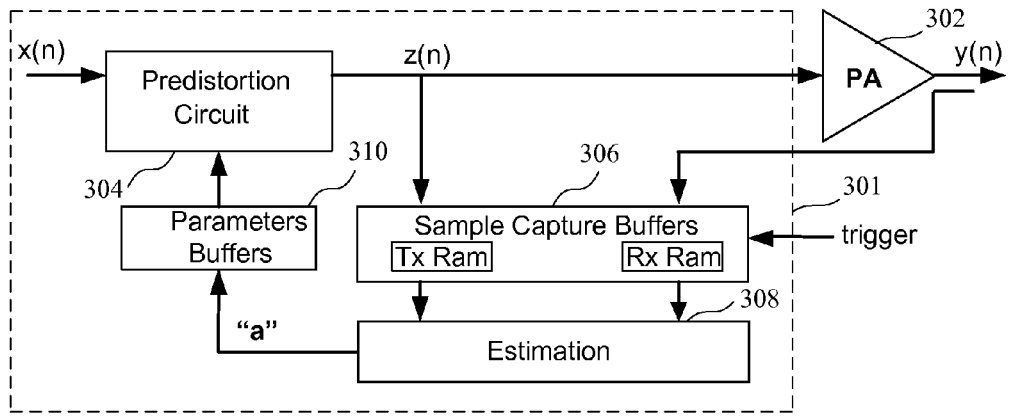
FIG. 3 is a block diagram of an integrated circuit having a circuit for reducing distortion at the output of a power amplifier according to an embodiment of the present invention.

Turning now to FIG. 3, a block diagram of an integrated circuit having a circuit for reducing distortion at the output of a power amplifier according to an embodiment of the present invention is shown. In particular, an integrated circuit 301 is coupled to a power amplifier 302. As will be described in more detail below, analog-to-digital (ND) and digital-to-analog (D/A) converters may be employed. The integrated circuit comprises a predistortion circuit 304 which is coupled to receive an input signal x(n) and generate an output signal z(n) which comprises a modified version of the input signal and is coupled to the power amplifier. As set forth above, the predistortion circuit modifies the input signal to compensate for distortion in the power amplifier such that the output y(n) of the power amplifier correlates to the input signal. A characterization event for generating parameters to apply to the predistortion circuit begins with a capture of a predetermined number L of samples of data from the input and output of the PA. The samples of the input are taken from the output of the predistortion circuit. Accordingly, the output of the predistortion circuit and the output of the power amplifier are coupled to sample capture buffers 306 having a transmit random access memory (TxRam) and a receive random access memory (RxRam).

Digital predistortion (DPD) involves performing the operations on a digital signal prior to digital-to-analog conversion. The samples from the output of the PA are typically obtained via some analog circuitry followed by an analog-to-digital converter, as will be described in more detail in reference to FIG. 5. As will further be described in more detail below, a trigger provided to the sample capture buffers enables the storing of the outputs of the predistortion circuit and the power amplifier based upon a detected power value for the input signal. The values stored in the sample capture buffers are provided to an estimation circuit 308. The estimation circuit will generate parameters "a" which will be applied to the predistortion circuit. The parameters may be coefficients of a transfer function, for example, which modify the input signal so that the output of the predistortion circuit offsets the distortion of the power amplifier. The new parameters "a" are stored in a parameters buffer 310 for use by the predistortion circuit. There are number of possible numerical techniques for generating the parameters. Discrete characterization events, where the coefficients are found that best match the PA during some period of L samples duration, may be employed. By way of example, Least Mean Squares estimation over the fixed block of L samples may be used. However, any other method known in the art for generating parameters for a predistortion circuit may be used.

Figure 4:
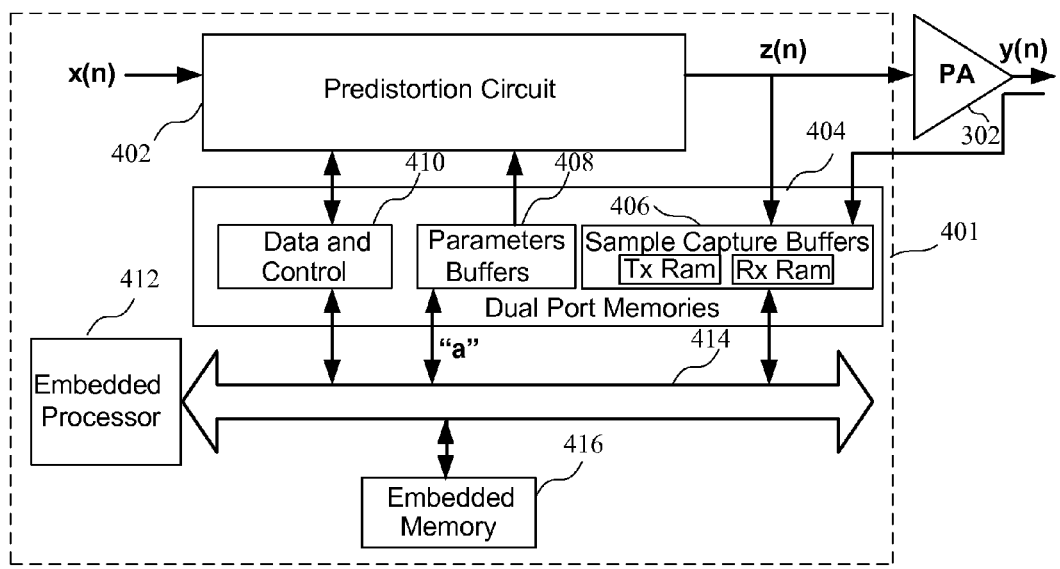
FIG. 4 is a block diagram of an integrated circuit having a circuit for reducing distortion at the output of a power amplifier and an embedded processor according to an embodiment of the present invention.

Turning now to FIG. 4, a block diagram of an integrated circuit having a circuit for reducing distortion at the output of a power amplifier and an embedded processor according to an embodiment of the present invention is shown. The integrated circuit 401 of FIG. 4 may be partitioned into components that process a real-time digitally sampled signal and components that relate to calculating the parameters "a" which may comprise estimation coefficients, for example. The real-time components of FIG. 4 may comprise the predistortion circuit 402 and memory elements 404, but may also include circuits for controlling these components, such as circuits applying a trigger signal to the sample capture buffers. The memory elements 404 may comprise sample capture buffers 406, parameter buffers 408, and data and control buffers 410. Communications between the real-time components are preferably made via dual-port random access memories (DPRAMs), which allow independent access to the memory contents from two sets of inputs and outputs. An embedded processor 412 may be used to provide the estimation function and generate the parameters for the predistortion circuit, which may be provided to the parameter buffers 408 by a bus 414. The main working memory for the processor preferably comprises a dedicated embedded memory 416, as shown, and all the data that is manipulated by the embedded processor may pass through the bus. As will be described in more detail below, multiple buses may be employed, depending upon the data stored in the various memories.

The predistortion circuit 402 may be implemented in configurable logic, such as configurable logic blocks of the circuit of FIG. 1. Similarly, the dual port memories may be implemented as dual port random access memories, and may be implemented in the BRAMs of FIG. 1. Finally, the embedded processor 412 may be the processor 110 of FIG. 1, where the estimation circuit may be implemented in software running on the embedded processor. The embedded processor may be constructed from available hardware resources, or may be implemented as a hardware primitive. By way of example, the embedded processor may be a hardwired processor, such as a PowerPC processor, or may be a processor implemented in configurable logic, such as a Microblaze processor, both of which are available from Xilinx, Inc. of San Jose, Calif. and implemented in Xilinx programmable logic devices.

An estimation sequence executed by the embedded processor will begin by reading and writing the Data and Control DPRAM to establish the trigger for the data capture, with possible conditioning based of the state of the transmitted data. For example, it would be unwise to attempt to generate estimation parameters during a time when there is no data being transmitted. After the L samples are captured in the capture buffers, these samples may then be processed by the estimation software running on the embedded processor to produce the parameters, which are then written into the parameters buffers. After the sample captures are processed, the sample capture buffers are available to the integrated circuit, and particularly the embedded processor for use as further working memory. This availability of memory after generating the parameters helps with overall hardware efficiency. In a practical system, other functions such as measurements of the transmitted signal may also be used by the estimation circuit, as will be described in more detail below in reference to FIG. 6. These real-time functions are included in the predistortion circuit, and the data and control memories are provided for the estimation circuit to enable these functions.

Figure 5:
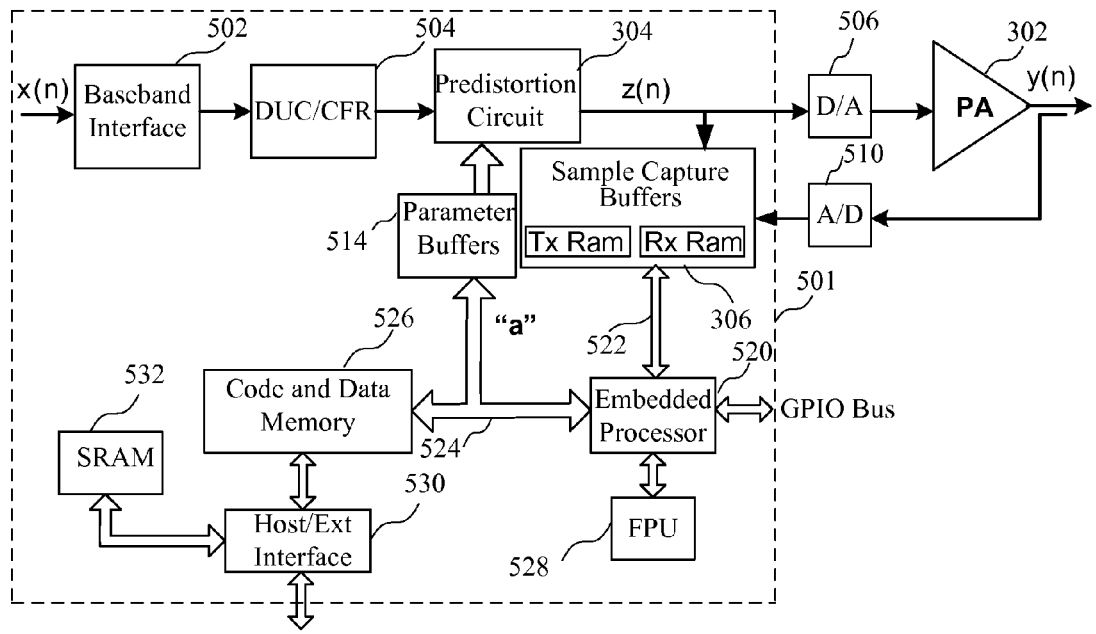
FIG. 5 is a block diagram of an integrated circuit having a circuit for reducing distortion at the output of a power amplifier and an embedded processor according to an alternate embodiment of the present invention.

Turning now to FIG. 5, a block diagram of an integrated circuit having a circuit for reducing distortion at the output of a power amplifier and an embedded processor according to an alternate embodiment of the present invention is shown. In particular, the integrated circuit 501 comprises a baseband interface 502 coupled to receive an input signal, the output of which is coupled to a DUC/CFR circuit 504. The DUC/CFR circuit 504 provides digital up conversion and crest factor reduction. Digital up conversion converts the input signal to the appropriate digital format, while crest factor reduction helps to reduce the peak-to-peak average power ratio, as is well known in the art. The output of the DUC/CFR circuit 504 is applied to the predistortion circuit 304, the output of which is coupled to both a digital-to-analog converter 506 and sample capture buffers 306. The sample capture buffers also receive an output from an analog-to-digital converter 510. As will be described in more detail below, an embedded processor 520 controls the sample capture buffers to ensure that the correct parameters are provided to the predistortion circuit. For example, the embedded processor ensures that the received samples are brought into alignment with the transmitted samples with respect to frequency, time and amplitude. In addition to the amplitude of the signals being aligned, any delay between the two signals will be eliminated to ensure that they are aligned in time. That is, because of the time required to pass through the power amplifier will cause the signals to be out of alignment, it is necessary to adjust the alignment of the signals. Finally, the delay aligned signal may be coupled to a frequency offset correction circuit to ensure that the frequencies of the signal are the same. This processing may be a part of the estimation circuit, and more particularly, a set of functions in the software running on the embedded processor. The processing may be done in real time as they are received, or after they are stored.

The embedded processor 520 may be coupled to a plurality of buses. For example, a first bus 522 may be used to transfer data between the sample capture buffers 512 and the embedded processor 520. A separate bus 524 may be used to couple data between the embedded processor and a code and data memory 526. The code and data memory be memory associated with the embedded processor. While a single bus may be used, one benefit of using multiple buses is that the data may be transferred at different data rates. For example, the data from a sample capture buffers may take additional clock cycles to be received because they are received from the programmable logic, while the data from the code and data memory 522 may be accessed directly by the embedded processor. Other circuits, such as a floating point unit (FPU) 528, may be coupled to the embedded processor. Similarly, a host/external interface 530 and a separate SRAM 532 may be used to provide data to the code and data memory 526. The code and data memory 526 may contain any necessary computer code or data required to implement the predistortion circuit using the embedded processor.

Figure 6:
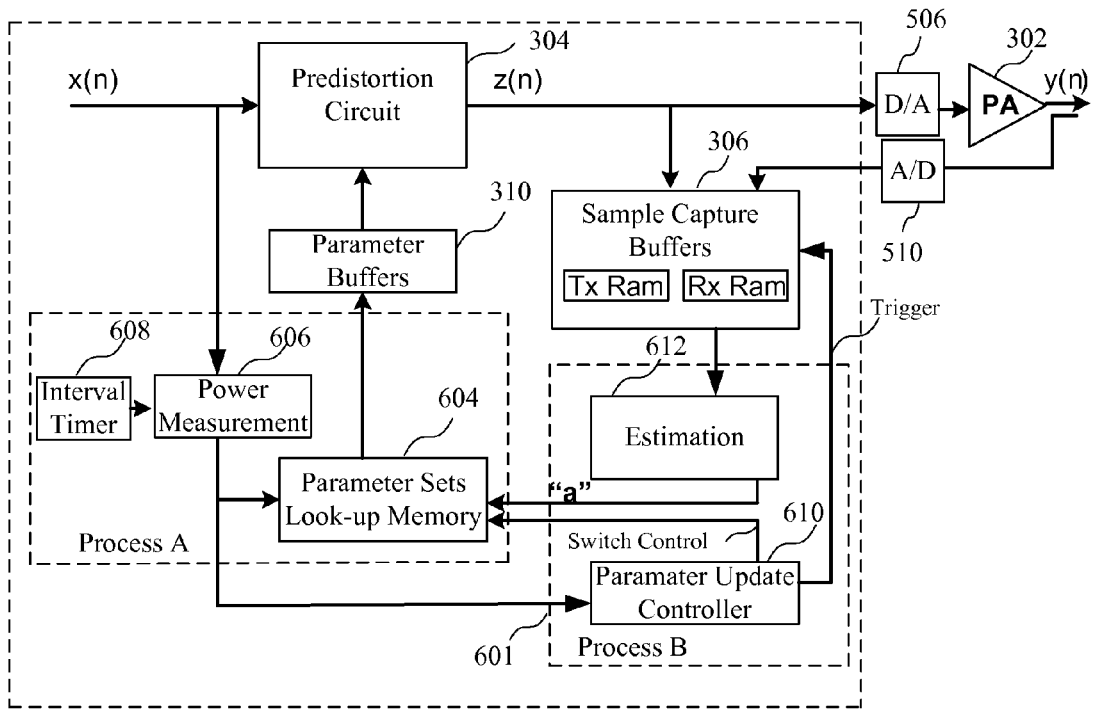
FIG. 6 is a block diagram of an integrated circuit having a circuit for reducing distortion at the output of a power amplifier and circuits for adapting coefficients according to an embodiment of the present invention.

Turning now to FIG. 6, a block diagram of an integrated circuit having circuits for adapting coefficients according to an embodiment of the present invention is shown. One problem faced in implementing a power amplifier in a system is that the average power that is being transmitted may change over time. For example, in a cellular communications system, a variation in average power may result from traffic density or call load. When predistortion parameters are calculated at one average power, the correction of the distortion may not be as beneficial when the transmitted signal changes to a different average power. Particularly, spectral compliance for adjacent channel power may not be achieved at the new power. According to one aspect of the invention, the circuit of FIG. 6 introduces a learning process which tracks the characteristics of the power amplifier, and which operates concurrently with a look-up function that applies different parameters in response to power changes. While the learning process involves the computationally intensive parameter estimation, only the look-up process, which is computationally simple, needs to track the power variations. Thus the computational throughput requirement is reduced, and a more compact integrated digital predistortion arrangement may be achieved.

In particular, the circuit of FIG. 3 has been modified as shown in FIG. 6 to include circuits for implementing a first process, designated as a Process A, for providing a lookup method for parameters which are applied to the predistortion circuit, and a second process, designated as a Process B, for updating the parameters. According to the embodiment of FIG. 6, a parameter sets look-up memory 604 is coupled to receive a power value, such as an average power of the input signal, from a power measurement circuit 606 to determine what values to apply to the predistortion circuit. The power measurement circuit may be controlled by an interval timer 608, for example, which determines the period of operation for Process A. That is, new parameters may be loaded into the parameter buffers on a periodic basis according to an output of the interval timer. The average power may be continuously and repeatedly measured over a time interval that is long enough to be representative of the statistics that determine the spectral character of the signal, such as average power, but short enough to track the call-load. The time interval for determining the average power may be calculated on an order of 10's of milliseconds, for example.

The parameters sets look-up memory contains N parameters sets with information tags, where N is a configuration variable greater than or equal to 1. The information tags may comprise, for example, metrics of the signal, such as an average power or the direction of the power of the signal, metrics of the capture that were used, such as a maximum index or number of peaks, or time, such as interval ticks. In response to the determination of a new power value, which may be generated once per interval, the parameters sets look-up memory updates the parameters in the parameter buffer used by the predistortion circuit. As will be described in more detail below, the parameters sets look-up memory rules may select a parameter set of the plurality of parameter sets according to range criteria. That is, a parameter set may represent a range of power values, and one parameter set may correspond to a given power measurement signal or other metric of the signal The parameter sets may be updated according to the Process B controlled by a parameters update controller 610. In particular, an estimation circuit 612 is coupled to receive the outputs of the sample capture buffers and generate the parameters, as set forth above. The parameters update controller is responsible for triggering the estimation process and overwriting parameter sets and information tags according to its defined rules. The parameters update controller rules are preferably also based on the power measurements. The parameters sets look-up memory and parameters update controller rules are driven by the characteristics of a PA when predistorted (i.e. specifically what happens when the signal power changes after the coefficients are calculated).

While Process B is also repetitive, it does not necessarily have a timer. Its period may be determined by the time taken for estimation, thereby improving hardware efficiency of the circuit. Estimation times of the order of seconds by the parameter updates controller are acceptable because the system is fully adaptive at the Process A interval rate once the parameters sets look-up memory is populated. Where a microprocessor is used for the estimation of parameters, the processes enabling predistortion, other than the power measurement which must involve real-time logic, may be implemented in software. Further, Process A and Process B could be concurrent tasks in a real-time operating system environment. Alternatively, with a single-thread program, Process B may be a loop and Process A may be an interrupt service routine, with the interrupt provided by the interval timer. While the circuits for implementing Process A and Process B have been shown in relation to the circuit of FIG. 3 by way of example, these circuits may also be implemented in the embodiments of FIGS. 4 and 5.

When determining parameters for a predistortion circuit, a problem occurs when the transmitted signal has a pulsed envelope, which is typical in high-speed data communications. If the data capture is made during the low period of the signal, the predistortion parameters will not be useful during the high periods of the signal because the range of data is insufficient. For good predistortion estimation, the capture needs to occur in the high period of the signal. The success of predistortion estimation is based on spectral emissions improvement. Accordingly, a statistical view of the spectral emissions is preferably used because a measurement interval must be defined for a spectrum. In practice, this may be related to the sweep time of the spectrum analyzer used for standards compliance testing. The estimation is based on discrete characterization events, where the parameters are estimated with a capture of L samples of data from the input and output of the PA. In practice, the period for collecting the L samples will be much shorter that the interval over which the spectral measurements are taken. The success of the estimation will depend on these short duration characterization events being sufficiently accurate for the longer interval. The circuits and methods of the present invention ensure that the L samples are statistically representative of the signal over a longer measurement interval.

Average power and amplitude histograms are continuously and repeatedly measured over a time interval that is long enough to be representative of the statistics that determine the spectral character of the signal. This interval will need to be of the order of 10's of milliseconds. Typically the minimum spectrum analyzer sweep time may be approximately 100 milliseconds and the maximum length of L samples may be approximately 20 microseconds. The average power is the accumulation of $|x(n)|^2$ over the Mean Signal Interval where a typical interval may be approximately 10 milliseconds. As will be described in more detail below, a histogram is created which comprises an accumulation of the number of occurrences of each of the discrete values of the signal amplitude $|x(n)|$ over the Mean Signal Interval.

Figure 7:
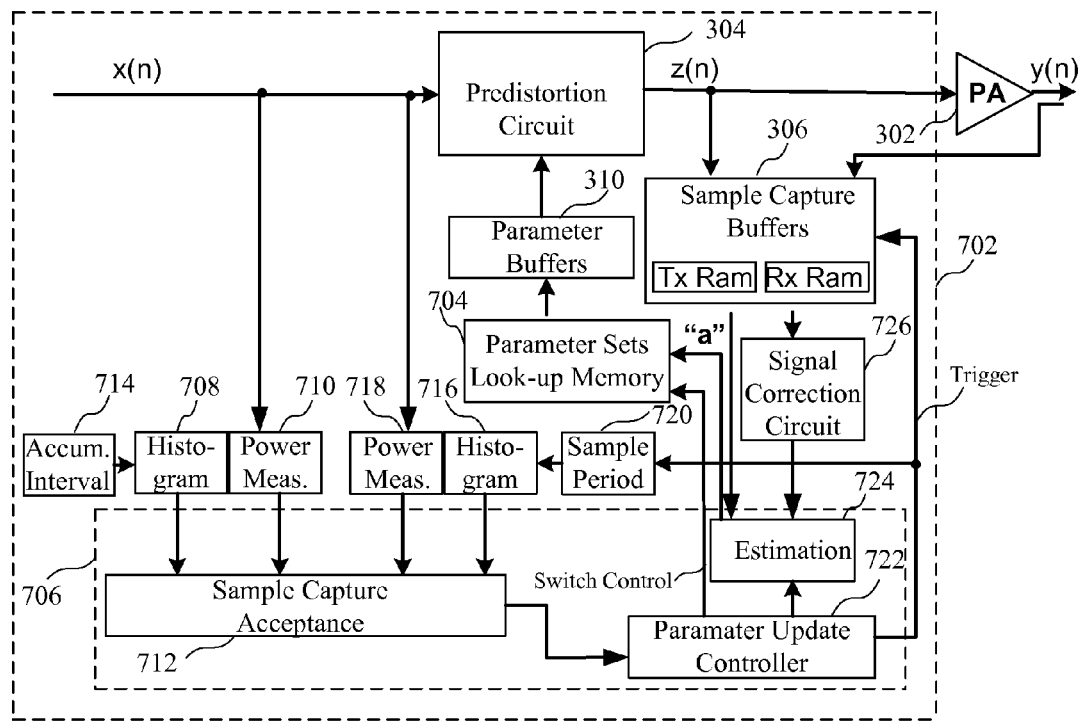
FIG. 7 is a block diagram of a circuit for generating parameters for a predistortion circuit according to an embodiment of the present invention.

Turning now to FIG. 7, a block diagram of a circuit for accepting a sample of an input signal to be used to calculate parameters for a predistortion circuit of an integrated circuit 702 is shown. The circuit of FIG. 3 has been modified to include a parameter sets look-up memory 704 which is coupled to receive updated parameters from a control circuit 706. The control circuit is coupled to receive data related to the information signal. In particular, a histogram 708 is created based upon data from a power measurement circuit 710 over the accumulation interval. The data may be used by a sample capture acceptance circuit 712 based upon a signal from an accumulation interval circuit 714.

Data related to a sample of the input signal may also be stored in a histogram 716 based upon an output of a power measurement circuit 718 in response to a control signal by a sample period circuit 720. As will be described in more detail below, it is the data in the histogram 716 taken over a short period of time that is compared against data in the histogram 708 taken over a long period of time to determine whether the data associated with the sample is acceptable data to be used to generate coefficients for the predistortion circuit. A parameter update controller 722 is coupled to receive the output of the sample capture acceptance circuit 712. The parameter update controller 722 is also coupled to an estimation circuit 724, which generates updated coefficients as described above and stored in the parameter sets look-up memory 704. The control circuit 706 may comprise a microprocessor running software for performing the sample capture acceptance function.

The input signal detected by the power measurement circuit may be represented in 16 bits, so that the amplitude will be a 15 bit number. In order to reduce the storage requirements, the amplitude may be truncated to N bits. By way of example, N=8 may be sufficient, resulting in 256 amplitudes which may be represented. According to one embodiment, the histogram circuit may comprise logic to initialize the RAM at the beginning of each measurement interval and to transfer the content to a buffer at the end of each measurement interval. When a capture of the input signal is triggered, the power and histogram are also computed over the interval of the capture, resulting in L samples. Acceptance criteria are then applied to the captured samples over the capture interval. As will be described in more detail below, the acceptance criteria may be based on a comparison of data derived from the power and histogram measurements over the capture interval with data derived from the power and histogram measurements over the Mean Signal Interval.

If the criteria are met as will be described in more detail below, the captured data is used for predistortion parameter estimation. If not, the capture is repeated. An upper limit on attempts to capture an acceptable sample to be used to generate parameters may be set as a system error threshold. That is, if acceptable data for generating predistortion parameters is not received with a predetermined period of time or within a predetermined number of attempts to acquire acceptable data, an error flag may be generated. While the circuit of FIG. 7 show modifications to the circuit of FIG. 3, the circuit may also include elements of the other embodiments set forth above. Although the descriptions of FIG. 7 relates to power measurements according to one embodiment, the circuit of FIG. 7 could measure any of the information tags set forth above, or some other metric for the input signal. According to one embodiment, each signal amplitude value addresses a storage location of a RAM, and data for that signal amplitude value is incremented every time that amplitude value occurs to create a count for each given signal amplitude value. The RAM preferably comprises a dual port RAM, enabling separately accessing the data using two ports.

Finally, a signal correction circuit 726 has been added. Signals coupled to the sample capture buffers will be adjusted to have the same amplitude and be aligned in time and frequency. In order for an estimation of parameters for a predistortion circuit to be successful, the amplitude of captured signal samples must be the same and the signals aligned before parameter estimation is performed with the data. In addition to having a circuit for adjusting the amplitude of the output signal, the signal correction circuit 726 may include a delay alignment circuit which will eliminate any delay between the two signals to ensure that they are aligned in time. That is, because of the time required to pass through the power amplifier will cause the signals to be out of alignment, it is necessary to adjust the alignment of the signals. Finally, the delay aligned signal output by a delay alignment circuit will be coupled to a frequency offset correction circuit. According to one aspect of the invention, frequency offset correction is provided to the processing chain prior to estimation. Frequency offset correction will improve the quality of the estimation, which may lead to improved spectral correction.

Figure 8:
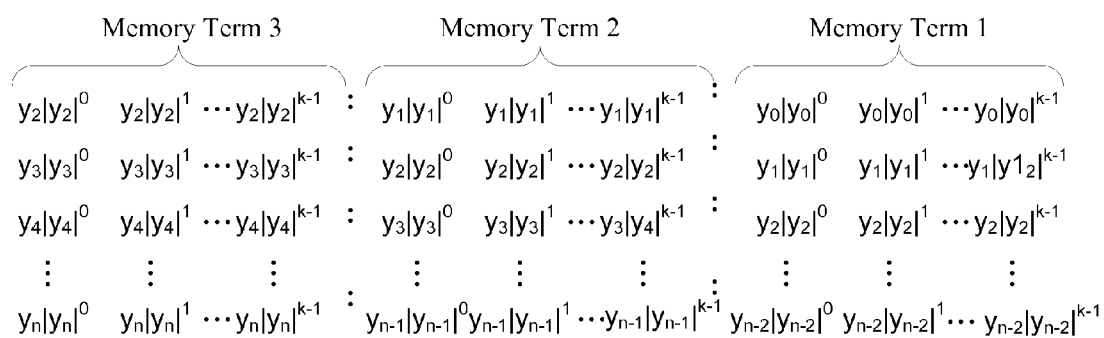
FIG. 8 is an example of a U-matrix according to an embodiment of the present invention.

Turning now to FIG. 8, an example of a U-matrix according to an embodiment of the present invention is shown. As will be described in more detail below, a U-matrix may be used to generate parameters for a predistortion circuit. The U-matrix requires a large amount of storage when built up directly. In general, a U-matrix requires 2*K*Q*L*8 bytes of storage, where Q is the number of memory terms, K is polynomial order, L is the number of samples captured, 2 for complex numbers and the 8 is due to using 64-bit storage. By way of example, typical parameters for a predistortion circuit might include 4 memory terms with a 5th order polynomial and 4 k samples captured. With this configuration, the memory necessary to store the U-matrix would be 1.28 MBytes. Because the memory required in the circuit is a function of predistortion parameters if stored directly, the system would have to be built to satisfy the worst case storage requirements, thus leaving unused storage when parameters less than the worst case scenario are selected.

According to one embodiment of the present invention, an alternative to direct storage of this matrix is provided. Because the matrix is highly structured and each element is a direct function of the first column in the matrix, it is possible to reduce the amount of required memory by using the circuits and methods of the present invention. The U-matrix shown in FIG. 8 by way of example includes three memory terms, where each memory term adds K columns to the matrix, and the first column of each memory term is simply the raw captured data from the output of the power amplifier. The structure is exploited in the matrix multiplication routines according to embodiments of the present invention to minimize any additional storage requirement above the memory required to store the original capture of the raw captured data from the output of the power amplifier. By storing only the first column of the U-matrix, less than 3 Kbytes of memory would be required to generate all of the parameters of a typical U-Matrix with 6 memory terms and 5 polynomial terms.

The U-matrix is defined as:

$$U_{KQ}(L) = y(L-Q)|y(L-Q)|^{K-1}.$$

The elements y(n) in the matrix U are the Rx samples received from the power amplifier. All columns of the U-matrix can be computed directly from the first column according to the equation set forth above. Hence, the full matrix does not need to be stored in memory. Instead the elements of the matrix are computed on the fly during the matrix multiplication process.

As can be seen, the first column comprises the captured data, and each subsequent column beyond the first column is generated by multiplying the term in the column by the absolute value of the captured data for that row. That is, $y_0 \ldots y_n$ represents the raw data, and each value for the U-matrix is generated based upon those values. For Memory Term 1, the entry in the second column is the entry in the first column (i.e. $y_0|y^0|^0$) multiplied by the $|y_0|$, while the entry in the third column is the entry in the second column multiplied by $|y_0|$. Accordingly, the generation of each of the columns in each of the rows is made by a multiplication of an absolute value of the captured data, eliminating exponential math to generate the entries in the U-matrix. Because the values of the U-matrix may be calculated on the fly, they do not necessary need to be stored, although they may be stored. By storing only the first column of the U-matrix, the memory requirements by the system will be greatly reduced.

Turning now to FIG. 9, a table shows the generation of parameters according to an embodiment of the present invention. Efficient memory usage is critical in an embedded memory intensive algorithm. Efficient memory usage is provided according to various aspects of the present invention described in more detail below. While Applicants make reference to various memories of FIG. 5 by way of example, it should be understood that other memories in the circuit shown above could be used, or other memories of other devices within the scope of the present invention. The circuit of FIG. 5 has four primary storage locations including the Tx capture RAM, Rx capture RAM, the SRAM and the internal memory of the embedded processor, shown here as the Code and Data Memory 526. The internal memory of the embedded processor is the "working memory" where all of the high speed accumulators, which will be described in more detail below, are kept. The values generated by the high speed accumulators are stored on the stack because it is temporary memory. Once the accumulations are done and the final values are copied into the capture RAM (i.e. slow memory), the fast internal memory of the embedded processor can be released and re-used by other functions. The table of FIG. 9 shows the memory usage during the steps of generating predistortion parameters. The generation of the U-matrix and the V-matrix minimizes the additional memory requirement above the available capture RAMs, where only small amounts of embedded processor memory are required to hold the final coefficients (a) and an intermediate vector (W). Because the intermediate matrices (required to generate the final coefficients) that require storage are either Hermitian or triangular, only the upper and diagonal elements of the matrix are required to be stored.

After initial conditions are set at a Step 1, trigger capture is performed as described above, where the Tx samples received from the output of the predistortion circuit are stored in the TX capture RAM and the Rx samples received from the output of the power amplifier are stored in the Rx capture RAM. While the Rx samples are intermediate frequency (IF) samples, they are converted at a Step 3 to base band (BB) samples. The Rx samples are then aligned with the Tx samples at a Step 4. A vector W is created at a Step 5, where $W=U^T Tx$, where $U^T$ is the transposed U-matrix generated as set forth above based upon Rx samples being the received data from which columns of the matrix are generated and Tx value comprises a vector. The W vector is stored in the embedded memory of the processor.

The V matrix is then computed by the multiplication of the transpose of U-matrix at a Step 6. The results of this matrix by matrix multiply is the square matrix V, where:

$$V = U^T U$$

The least significant words of the V matrix are stored in the Tx capture RAM while the most significant words of the V matrix are stored in the Rx capture RAM. $K^2*M$ 64 bit words for a first set of rows are stored in the internal memory of the embedded processor. The remaining steps enable calculating a vector a representing parameters for the predistortion circuit. According to one embodiment, a Cholesky factorization is performed on V at a Step 7, where $R'*R=V$. The least significant words of the R matrix are stored in the Tx capture RAM while the most significant words of the R matrix are stored in the Rx capture RAM. As can be seen, the W vector is stored in the memory of the embedded processor until the value for "a" is computed in a Step 8, where a=R\(R'\W). The value of "a" is then converted to an integer at a Step 9.

Figure 10:
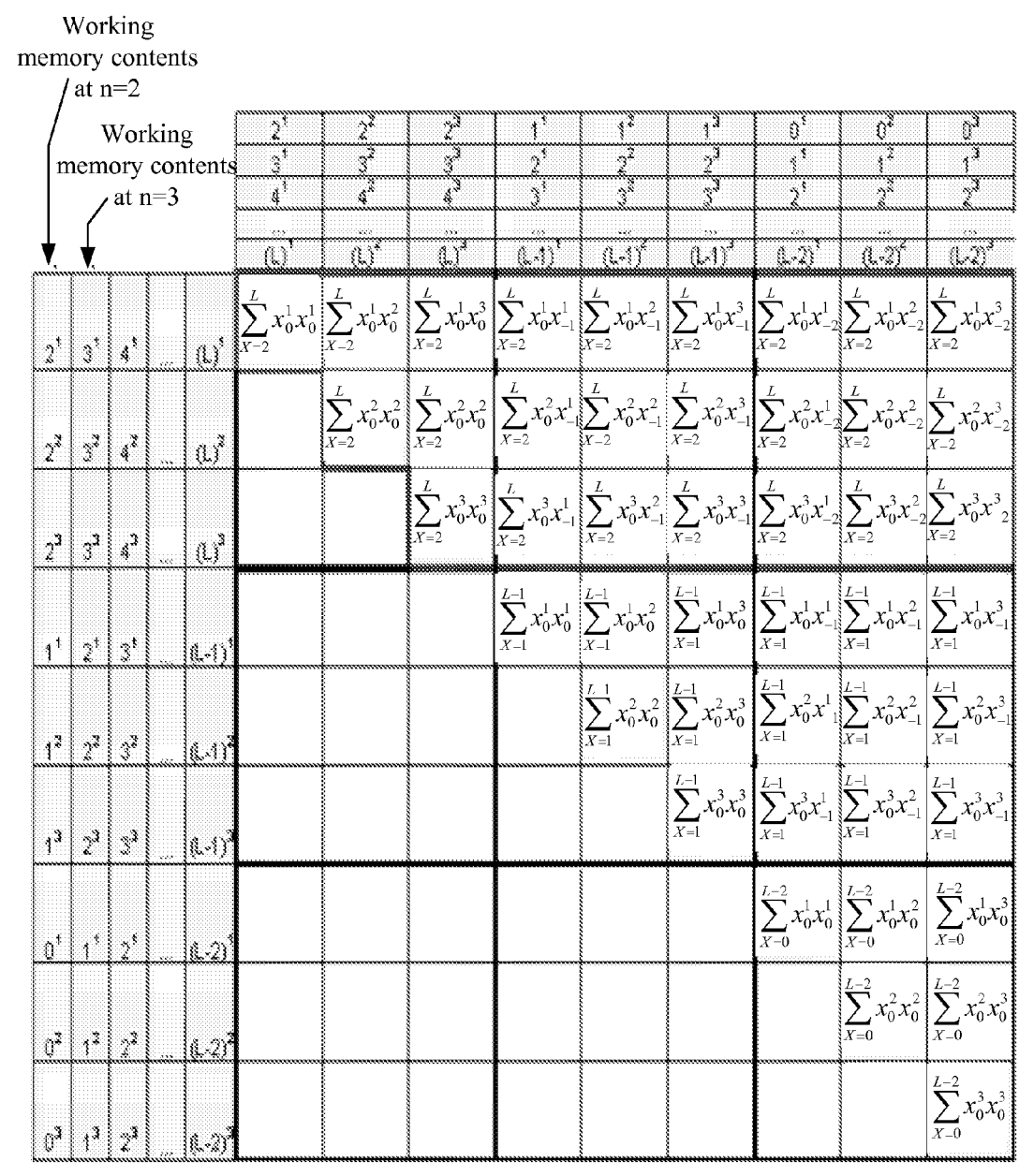

Turning now to FIG. 10, a matrix is generated using matrix multiplication according to an embodiment of the present invention. The methods of the present invention provide an efficient looping structure to generate the V matrix and to produce a fast implementation. By generating the U-matrix as set forth above, the CPU cycles and storage requirements will be significantly reduced. As seen above the elements of the V-matrix contain terms of the form $|y(L-Q)|^{K-1}$ of the U-matrix, so each term requires a complex absolute value followed by an integer power function. The U-Matrix and the transposed U_matrix having $X^k$ values shown on the side and the top of the V-Matrix are generated as described above. The looping structure that has been implemented eliminates the power function and requires only a single absolute value for each complex sample stored in the capture RAM.

In FIG. 10, a compressed nomenclature has been used in an attempt to simplify the diagram using 3 memory terms, 3 polynomial terms and L samples, for example. The figure shows the standard matrix by matrix transpose multiply, which will result in a 9×9 Hermitian matrix at the output of the multiply. Exploiting the Hermitian properties allows computation and storage of only the diagonal and upper triangular terms. Accordingly, this 9×9 matrix requires computing 45 terms, which are represented by the accumulators shown. For the terms of the V-matrix, a nomenclature of $x_q^k$ corresponds to $|y(x-q)^k$ as described in the equation above, where the U-matrix the term $2^k$ means the $3^{rd}$ element in the Rx capture RAM who absolute value has been raised to the $k^{th}$ power. As shown, the first column of the U-Matrix comprises the working contents of the memory at a first time n=2, and the second column of the U-Matrix comprises the working contents of the memory at a next time n=3, etc.

Additional commonalities between matrix elements may be exploited to further reduce the number of terms that need to be accumulated from scratch. The first group of K rows is very similar to the second and third groups of K rows. They differ only in that the terms are "shifted" over by K columns and the start/stop index of the accumulation if different by 1. It is desirable to use "fast" memory to store and build up the accumulators. In this case the memory on the stack works nicely. Only the first K rows of accumulators needs to be build up on the stack, so only M*K*K elements of temporary storage are needed. The first K rows of accumulators are built up efficiently by maintaining a "working memory" vector. This vector contains one of the columns of the U-matrix as shown below. At each step, a new Rx term is loaded in, the complex absolute value is computed and the power terms are computed sequentially. These new terms are shifted into the working memory while shifting out the oldest K terms. The working memory contains all of the required elements to increment all of the first K row accumulators.

Once all of the first K row accumulators are completed, the routine reads in from the capture RAM a few remaining terms that will be needed to adjust the first K rows to get the second and third K rows. Once these terms are read in, the contents of the capture RAM is no longer need and this memory is now free. Additionally, the amount of memory access required is greatly reduced form this point forward, so the first K rows are then copied into the capture RAM, which has potentially slower access then the memory on the stack. These first K rows are now used to compute the next group by subtracting appropriate terms then adding in new ones to make the range of accumulation correct. This continues for all subsequent groups, which are stored directly to the capture RAM.

Figure 11:
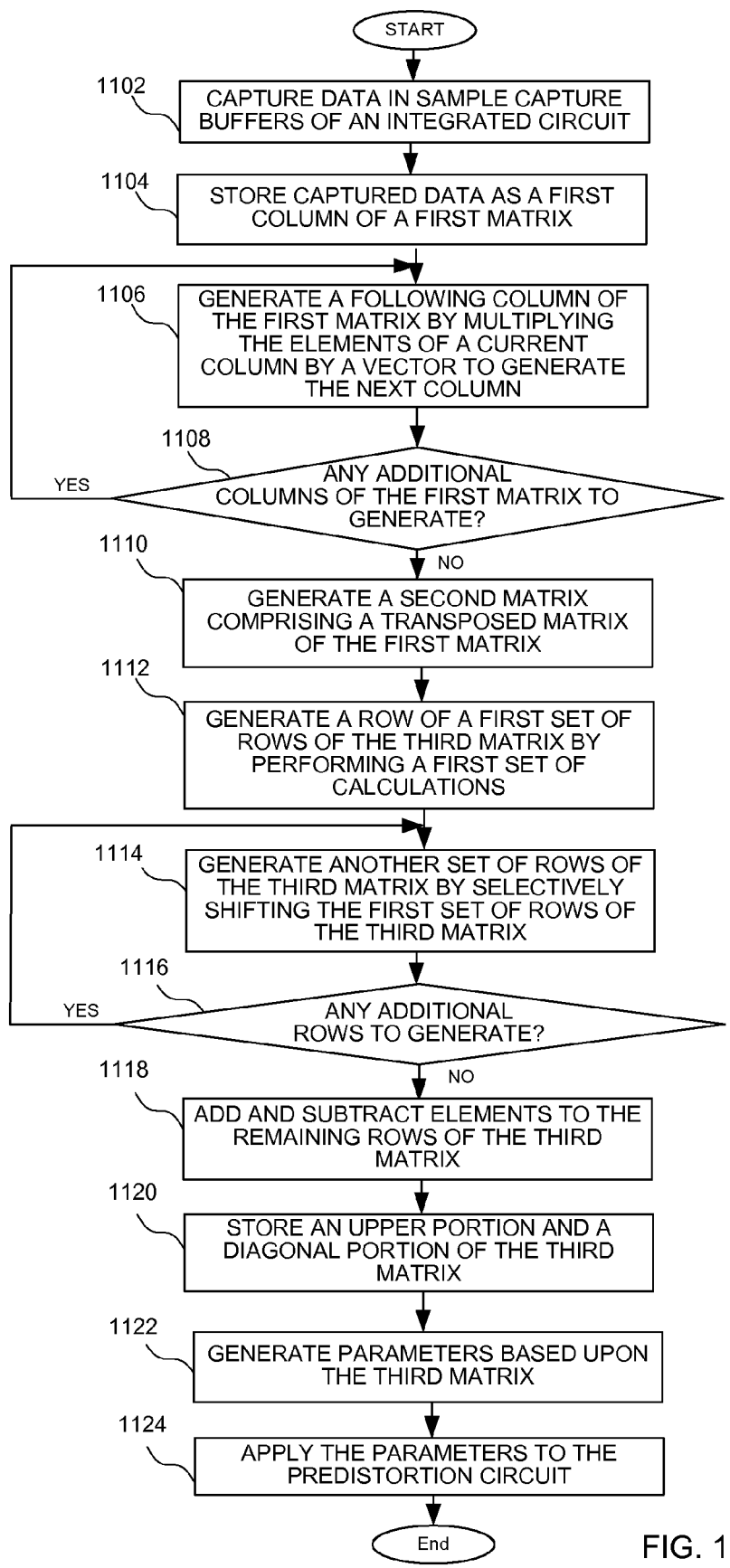
FIG. 11 is a flow chart showing a method of generating parameters for a predistortion circuit according to an embodiment the present invention.

Finally, turning to FIG. 11, a flow chart shows a method of generating parameters for a predistortion circuit according to an embodiment the present invention. In particular, data is captured in sample capture buffers of an integrated circuit at a step 1102. The captured data is stored as a first column of a first matrix at a step 1104. A following column of the first matrix is generated by multiplying the elements of a current column by a vector to generate the next column at a step 1106. It is then determined whether any additional columns of the first matrix need to be generated at a step 1108. A second matrix comprising a transposed matrix of the first matrix is generated at a step 1110. A row of a first set of rows of the third matrix is generated by performing a first set of calculations at a step 1112. It is then determined whether there are any additional rows that need to be generated at a step 1114. The remaining rows of the first set of rows of the third matrix are generated by selectively shifting the first set of rows of the third matrix at a step 1116. Elements are added and subtracted to the remaining rows of the third matrix at a step 1118. An upper portion and a diagonal portion of the third matrix are stored at a step 1120. Parameters based upon the third matrix are generated at a step 1122. The parameters are then applied to the predistortion circuit at a step 1124. The circuit of FIG. 11 may be implemented using any of the other circuits of FIGS. 1-10 as described.

It can therefore be appreciated that the new and novel circuit for and method of generating parameters for a predistortion circuit in an integrated circuit using a matrix has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of generating parameters for a predistortion circuit in an integrated circuit using a matrix, the method comprising:
    storing data in a first column of a first matrix in a memory;
    generating, using a processor, data in the remaining columns of the first matrix based upon the first column of the matrix;
    generating data in a plurality of rows of a second matrix by performing a first set of calculations using the data in the first matrix; and
    generating data in the remaining rows of the second matrix by selectively shifting the data in the plurality of rows of the second matrix.

2. The method of claim 1 further comprising generating data in a third matrix comprising a transposed matrix of the first matrix,
    wherein generating data in a plurality of rows of a second matrix comprises generating the data in the plurality of rows of the second matrix using the data in the first matrix and the data in the third matrix.

3. The method of claim 2 wherein generating data in a plurality of rows of a second matrix comprises multiplying data in rows of the first matrix by data in columns of the third matrix.

4. The method of claim 1 wherein generating data in the remaining rows of a second matrix further comprises selectively adding and subtracting values from the data of the plurality of rows of the second matrix.

5. The method of claim 1 wherein generating data in the remaining columns of the first matrix comprises sequentially multiplying the data of a column by a vector to generate the next column.

6. The method of claim 1 further comprising storing data in an upper portion and a diagonal portion of the second matrix.

7. The method of claim 1 further comprising generating parameters based upon data in the second matrix.

8. A method of generating parameters for a predistortion circuit in an integrated circuit using a matrix, the method comprising:
- capturing data at an output of the predistortion circuit in sample capture buffers of the integrated circuit;
- storing data in a first column of a first matrix in a memory which may be directly accessed by a processor of the integrated circuit;
- generating, using a processor, data in the remaining columns of the first matrix based upon data in the first column of the first matrix;
- generating data in a plurality of rows of a second matrix by performing a first set of calculations using data in the first matrix; and
- generating the remaining rows of the second matrix by selectively shifting the data in the plurality of rows of the second matrix.

9. The method of claim 8 further comprising storing data in the second matrix in the sample capture buffers.

10. The method of claim 8 further comprising generating data in a third matrix comprising a transposed matrix of the first matrix, wherein generating data in a plurality of rows of a second matrix comprises generating the data in the plurality of rows of the second matrix using the data of the first matrix and the data of the third matrix.

11. The method of claim 10 wherein generating data in a second matrix comprises multiplying data in the first matrix by data in the third matrix.

12. The method of claim 8 further comprising generating a vector for calculating the parameters and storing the vector in a memory accessible by a processor of the integrated circuit.

13. The method of claim 12 further comprising calculating the parameters and storing the parameters in a memory accessible by the predistortion circuit.

14. The method of claim 13 further comprising applying the parameters to the predistortion circuit.

15. A circuit for generating parameters in an integrated circuit using a matrix, the circuit comprising:
- a predistortion circuit;
- sample capture buffers for receiving data from the predistortion circuit and data output by a power amplifier and received by the integrated circuit;
- an embedded processor of the integrated circuit coupled to the predistortion circuit; and
- a first memory coupled to the embedded processor of the integrated circuit, the first memory storing data in a first column of a first matrix;
- wherein the embedded processor generates data in the remaining columns of the first matrix and data in predetermined rows of a second matrix based upon the data in the first matrix.

16. The circuit of claim 15 wherein the embedded processor is coupled to the sample capture buffers and generates the parameters for the predistortion circuit based upon the data from the predistortion circuit and the data output by a power amplifier.

17. The circuit of claim 16 further comprising parameter buffers coupled to the embedded processor, the parameter buffers storing the parameters generated by the embedded processor.

18. The circuit of claim 15 wherein a portion of the second matrix is stored in the sample capture buffers.

19. The circuit of claim 15 wherein the sample capture buffers comprise BRAMs of a device having programmable logic.

20. The circuit of claim 19 wherein the first memory comprises a memory associated with the embedded processor of the device having programmable logic.

* * * * *